(54) ASYNCHRONOUS BIST FOR EMBEDDED MULTIPORT MEMORIES

(75) Inventors: Tuan Phan, Santa Clara, CA (US); Thompson W. Crosby, San Jose, CA (US); V. Swamy Irrinki, Milpitas, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/420,636

(22) Filed: Oct. 21, 1999

(51) Int. Cl.[7] ............................................. G01R 31/28
(52) U.S. Cl. ...................................... 714/733; 714/744
(58) Field of Search .............................. 714/733, 718, 714/700, 710, 7, 726, 30, 42, 744; 365/300, 189.09, 230, 230.03, 201, 200; 324/765, 537, 763; 710/129; 375/371

(56) References Cited

U.S. PATENT DOCUMENTS

| | | | | |
|---|---|---|---|---|
| 5,349,587 A | * | 9/1994 | Nadeau-Dostie et al. | 371/22.3 |
| 5,394,403 A | * | 2/1995 | Klein | 371/22.3 |
| 5,488,614 A | * | 1/1996 | Shima | 371/22.3 |
| 5,535,164 A | * | 7/1996 | Adams et al. | 365/201 |
| 5,675,545 A | * | 10/1997 | Madhavan et al. | 365/201 |
| 5,793,822 A | | 8/1998 | Anderson et al. | 375/371 |
| 5,796,745 A | * | 8/1998 | Adams et al. | 714/718 |
| 5,822,228 A | | 10/1998 | Irrinki et al. | 364/580 |
| 5,909,404 A | | 6/1999 | Schwarz | 365/201 |
| 6,145,105 A | * | 11/2000 | Nadeau-Dostie et al. | 714/726 |
| 6,510,530 B1 | * | 1/2003 | Wu et al. | 714/30 |

* cited by examiner

Primary Examiner—Albert Decady
Assistant Examiner—Mujtaba Chaudry
(74) Attorney, Agent, or Firm—Conley Rose

(57) ABSTRACT

A method and apparatus are disclosed for asynchronous testing of multiport memories. In one embodiment, the apparatus includes a built-in self-test (BIST) unit coupled to a multiport memory module and configured to apply a pattern of read and write test operations concurrently to multiple ports of the memory. The pattern of test operations may be any standard or customized pattern designed to establish the functionality of the multiport memory. The test operations to different ports are clocked by different clock signals so that the clock signals may be offset relative to each other by an adjustable or preset clock skew. Certain clock skews cause transitions to occur on signal lines in the memory array at the most sensitive portion(s) of a read cycle. The timing of these transitions, in combination with the presence of high-resistivity bridge faults, sufficiently disturbs the read cycle so as to cause a read error, thereby enabling detection of the bridge faults.

19 Claims, 4 Drawing Sheets

US 6,671,842 B1

ASYNCHRONOUS BIST FOR EMBEDDED MULTIPORT MEMORIES

BACKGROUND OF THE INVENTION

1. Field of the Invention

This invention relates to the field of digital electronic memory devices, and in particular a method and apparatus for testing embedded asynchronous multiport memories.

2. Description of the Related Art

It is common practice for the manufacturers of memory chips to test the functionality of the memories at the manufacturing site. After the chips have been tested and certified for shipment, upon sale to the users, the users generally depend upon the reliability of the chips for their own systems to function properly. As the line width of memory cells within a memory array circuit chip continue to shrink (now at less than half a micron), this reliability becomes more difficult to achieve. One of the challenges for the manufacturers of memory devices, is to increase memory capacity without decreasing chip yields due to malfunctioning parts.

Before the memory chips are released for shipment, they typically undergo testing to verify that the support circuitry for the memory array and each of the memory cells within the memory array is functioning properly. This testing method is routinely done because it is not uncommon for a significant percentage of the memory cells within the chip to fail, either because of manufacturing defects or degradation faults.

One standard way for testing chip memories involves using an external memory tester or Automatic Test Equipment (ATE) at the manufacturing site. An external memory tester supplies power and applies test patterns to the chip to detect faults. External memory testers can only test a limited number of chips at a time, and the test speed is limited by the external bus speed. Consequently, this method of testing is expensive, both in terms of equipment costs and time requirements.

Partly to address these issues, and partly to provide off-site testing, built-in self-testers (BIST) have been incorporated into memory chips as a matter of course. Automated test equipment can now be simplified to the extent that the only necessary functions are to supply power (and sometimes a clock signal) to the memory chip, and to monitor a single output signal from the chip. The on-board BIST unit generates all the test patterns and asserts the output signal if the chip passes the functionality test. The BIST can be configured to run every time the chip is powered-on, or the BIST may be configured to run only when a test mode signal is asserted.

The BIST unit operates by writing and reading various patterns to/from the memory to determine various kinds of memory faults. In general, a BIST unit writes a data value to a memory cell and subsequently reads the memory cell. By comparing the data written and the data subsequently returned from the memory cell, the BIST unit is able to determine whether the memory cell is faulty. Several classes of fault detection methods are well known, as illustrated by E. R. Hnatek in "4-Kilobit Memories Present a Challenge to Testing", *Computer Design*, May 1975, pp. 117–125, which is hereby incorporated herein by reference. As Hnatek discusses, there are several considerations that should be taken into account when selecting a fault detection method, including fault coverage and length of the test procedure. Also, since no practical method provides complete coverage, the suitability of the various methods for detecting particular types of faults should be considered.

Multiport memories present special BIST challenges, in that the various ports need to be exercised simultaneously to verify functionality. One BIST for multiport memories is taught by U.S. patent application Ser. No. 09/363,697 entitled "Detecting Interport Faults in Multiport Static Memories" by inventors J. Zhao, et al., which is hereby incorporated herein by reference. The existing multiport BIST techniques of which the author is aware are similar to single port techniques, except that provisions are made to ensure detection of short circuits between the word lines or bit lines of different ports. Such techniques have proven inadequate, as they fail to detect high-resistivity "bridges" that can nonetheless cause the memory array to operate incorrectly. As these faults are regrettably not uncommon, an improved multiport memory BIST is needed to prevent faulty chips from leaving the factory.

SUMMARY OF THE INVENTION

Accordingly, there is disclosed herein a method and apparatus for asynchronous testing of multiport memories. In one embodiment, the apparatus includes a built-in self-test (BIST) unit coupled to a multiport memory module and configured to apply a pattern of read and write test operations concurrently to multiple ports of the memory. The pattern of test operations may be any standard or customized pattern designed to establish the functionality of the multiport memory. The test operations to different ports are clocked by different clock signals so that the clock signals may be offset relative to each other by an adjustable or preset clock skew. Certain clock skews cause transitions to occur on signal lines in the memory array at the most sensitive portion(s) of a read cycle. The timing of these transitions, in combination with the presence of high-resistivity bridge faults, sufficiently disturbs the read cycle so as to cause a read error, thereby enabling detection of the bridge faults. Accordingly, the clock skew is preferably set to a selected value or is swept across a selected skew range which is determined to cause the desired effect.

BRIEF DESCRIPTION OF THE DRAWINGS

Other objects and advantages of the invention will become apparent upon reading the following detailed description and upon reference to the accompanying drawings in which.

Figure 1:
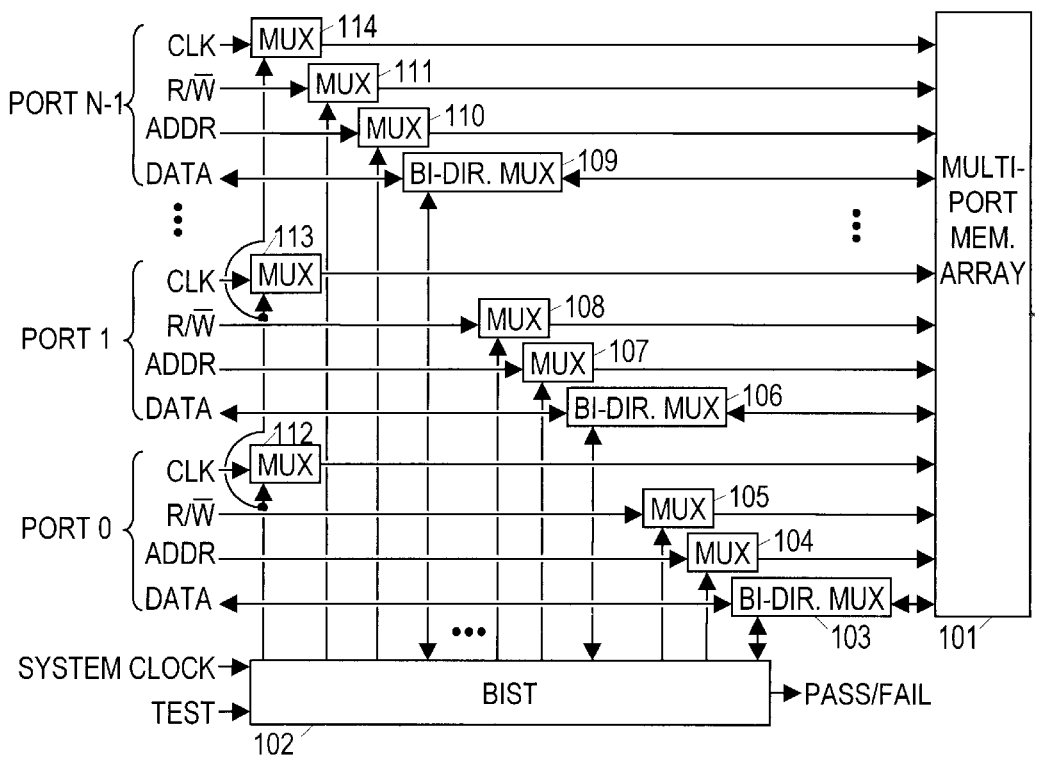
FIG. 1 depicts a functional block diagram of a device having a first multiport BIST configuration.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

In the following description, the terms "assert" and "deassert" are used when discussing logic signals. When a logic signal is said to be asserted, this indicates that an active-high signal is driven high, whereas an active-low signal is driven low. Conversely, de-assertion indicates that an active-high signal is driven low, and that an active-low signal is driven high.

DETAILED DESCRIPTION OF THE INVENTION

Turning now to FIG. 1, device 100 includes a multiport memory array 101 and a BIST unit 102 which is coupled to the memory array through multiplexers 103–114 that may be controlled by BIST 102. Each of the memory ports 0 through N–1 have a set of signal lines that include a clock line (CLK), a read/write line (R/W), a set of address lines (ADDR), and a set of bi-directional data lines (DATA). From each port, the memory array 101 receives an address signal, a read/write signal, and a clock signal, and either receives or provides a data signal. If the read/write signal indicates a write operation, memory array 101 stores the data represented by the data signal in a memory location indicated by the address signal. If the read/write signal indicates a read operation, memory array 101 detects the data stored in the memory location indicated by the address signal and drives the data signal on the data lines. The multiplexers 103–114 provide for steering and re-direction of the address, data, clock, and read/write signals.

When a test mode signal (TEST) to the BIST 102 is asserted, BIST 102 switches the multiplexers 103–114 so that the BIST 102 has access to the signal lines of each port. The test signal may be asserted by an operating system or software application running on a CPU coupled to the memory device 100, or it may be asserted in response to an event such as power-on, reset, reaching a predetermined temperature, or expiry of a predetermined time delay.

Multiplexers 103, 106, and 109, are bi-directional so that BIST 102 can both read from and write to memory array 101. In the configuration shown in FIG. 1, the BIST unit 102 generates a shared clock signal from the system clock signal (SYSTEM CLOCK). The shared clock signal is provided to clock multiplexers 112–114 so that, during testing of multiport memory array 101, each of the ports is clocked by the shared clock signal. BIST unit 102 applies a multiport test pattern to memory array 101 using the common clock signal, and upon completion of the test, asserts the pass/fail signal to indicate if no faults have been detected or de-asserts the pass/fail signal to indicate that one or more faults have been detected. Typical faults detected by BIST include column faults, row faults, bridging faults, "stuck at" faults, and data retention faults. Column and row faults are caused by defective bit lines and defective word lines, respectively. A bridging fault indicates a cell is shorted to an adjoining cell, and stuck-at faults indicate a particular cell is "stuck" at a certain value. Data retention faults indicate the cell has failed to retain the data written to it.

It is noted that this configuration is synchronous, and consequently exhibits no clock skew. This configuration will fail to detect resistive bridge faults that may cause incorrect operation of the memory array only during asynchronous operation.

Figure 2:
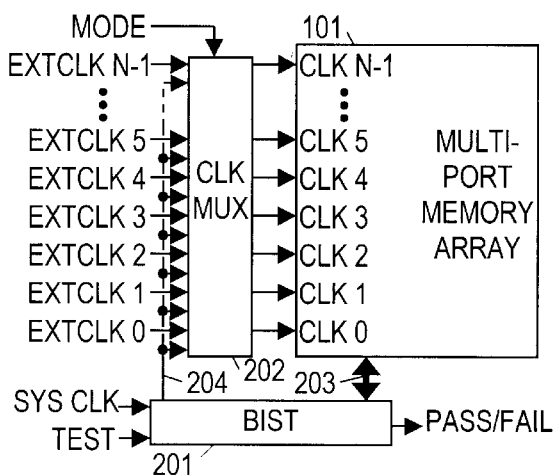
FIG. 2 depicts a functional block diagram of a device having a second multiport BIST configuration.
Figure 5A:
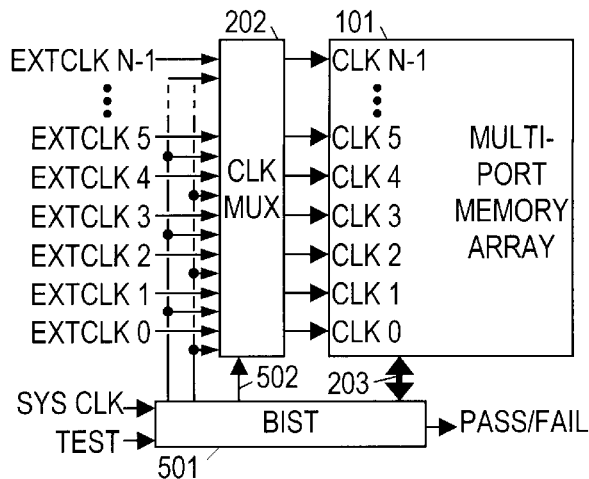
FIG. 5A depicts a functional block diagram of a device having a multiport BIST configuration with two test clock signals.
Figure 5B:
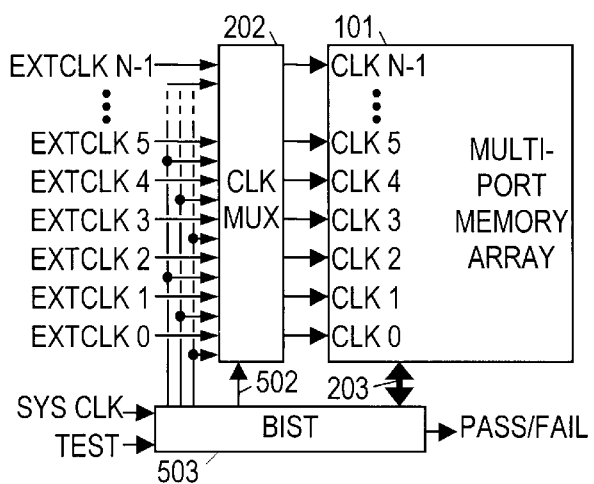
FIG. 5B depicts a functional block diagram of a device having a multiport BIST configuration with three test clock signals.

In the following Figures, the clock multiplexers 112–114 are combined into a single functional block, and the remaining multiplexers 103–114 are omitted for clarity. In FIGS. 2, 5A and 5B, the clock multiplexers 112–114 are shown as clock multiplexing block 202, and multiport memory array 101 is presumed to be the same as in FIG. 1. Signal set 203 includes the read/write signal lines, address signal lines, and bi-directional data signal lines for all of the memory ports.

FIG. 2 shows a BIST configuration 200 in which a BIST unit 201 provides a shared clock signal 204 to clock multiplexer block 202. However, BIST unit 201 does not control clock multiplexer block 202. Rather, control multiplexer block 202 is controlled by a test mode signal (MODE). This mode signal may be externally sourced, or it may be asserted on-board the chip in response to detection of a port clock signal during assertion of the test signal (TEST). BIST configuration 200 allows use of clock signals sourced from off-chip to clock the test pattern operations to the multiple ports of the memory array 101.

Figure 7:
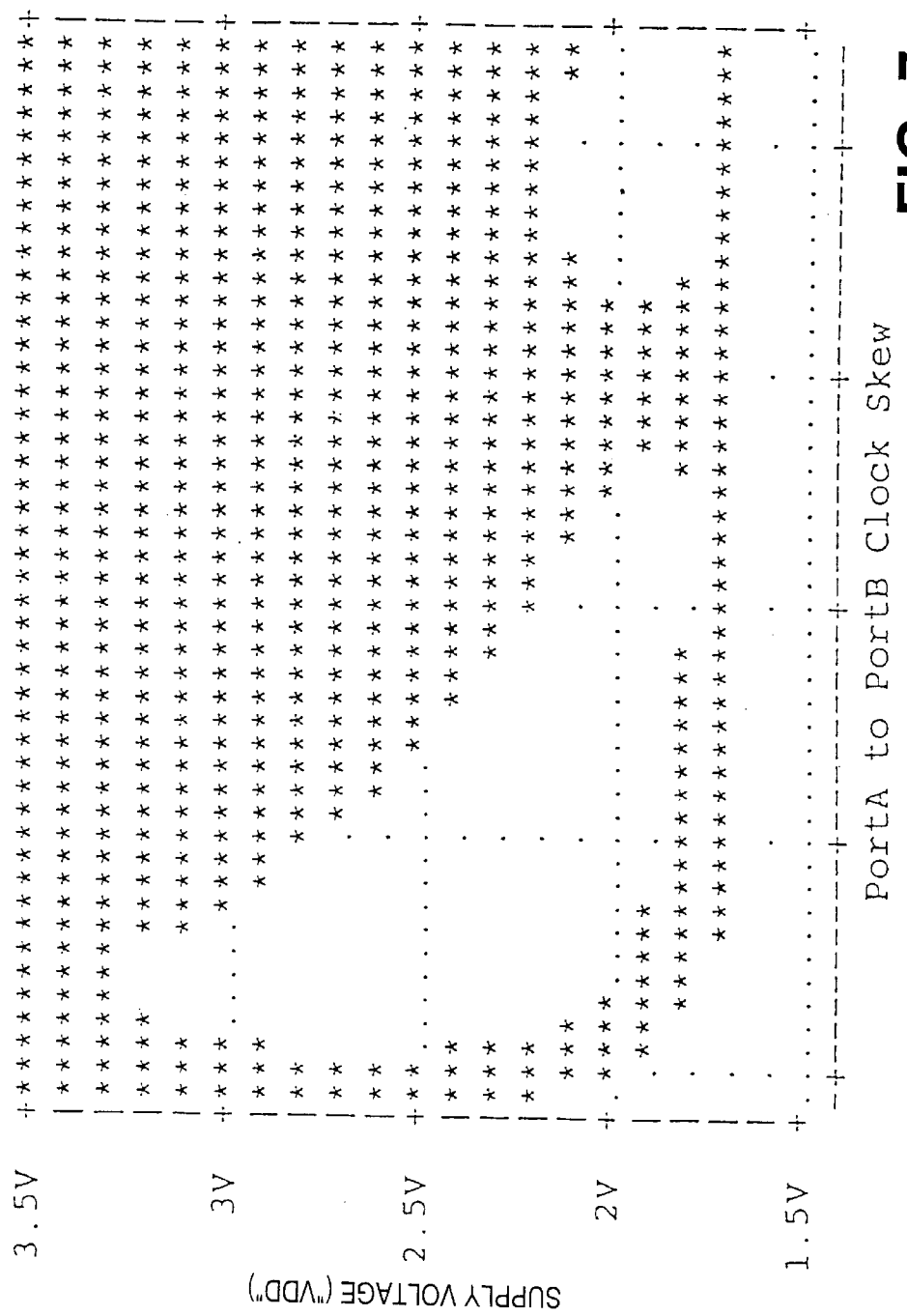
FIG. 7 is a "schmoo" plot of BIST results as a function of supply voltage and clock skew for a two-port memory device.

A device having BIST configuration 200 may be placed in an external tester which provides power and a port clock signal for each port. The external tester asserts the test signal and monitors the pass/fail signal. The BIST may be repeated over a range of clock skews between the port signals and over a range of supply voltages. FIG. 7 shows an example of the results for a device with an embedded two port FIFO. In FIG. 7, an asterisk indicates a successful completion of the BIST. Even at the nominal operating power supply voltage of 2.67 V, there is a range of clock skews over which the BIST detects faulty operation of the memory array. The test pattern used for this example uses a "checkerboard" pattern of alternating 1's and 0's along columns and rows of the memory array. A simple scan-type algorithm is used in which one port writes the checkerboard pattern to the memory array while the other port concurrently reads oppositely-valued data (such as the data that was written in the previous cycle).

The use of a clock skew between port clocks allows the BIST to detect so-called "soft failures", i.e. weakened memory cells that could still function under ideal operating conditions. These soft failures become detectable when disturbances are present at a sensitive portion of the read cycle. The most sensitive portion of a read cycle is the time shortly before and during the sensing of the bit lines. At this portion of the cycle, disturbances can cause a change in the time required to charge the bit lines, which may prevent the bit lines from reaching the desired voltage before they are sensed, and the disturbances can cause noise on the bit lines which may cause the bit lines to be read incorrectly.

The disturbances may arise from at least two sources. The first disturbance source includes the power droops and ground bounces that occur when a lot of large transistors are transitioning at the same time. In a memory, this primarily occurs when address decoders, sense-amplifiers, and I/O drivers are switching. I/O drivers may be the largest contributor from this group. The second disturbance source includes capacitive coupling caused by the parasitic capacitances between the long, parallel, metal traces of the bit lines. Soft failures may have a reduced ability to overcome the parasitic capacitances, and this reduced ability may be exposed by switching noise that occurs at an inopportune time. Accordingly, the clock skew is preferably selected so that the worst-case timing occurs to maximally stress the memory cells.

Figure 3:
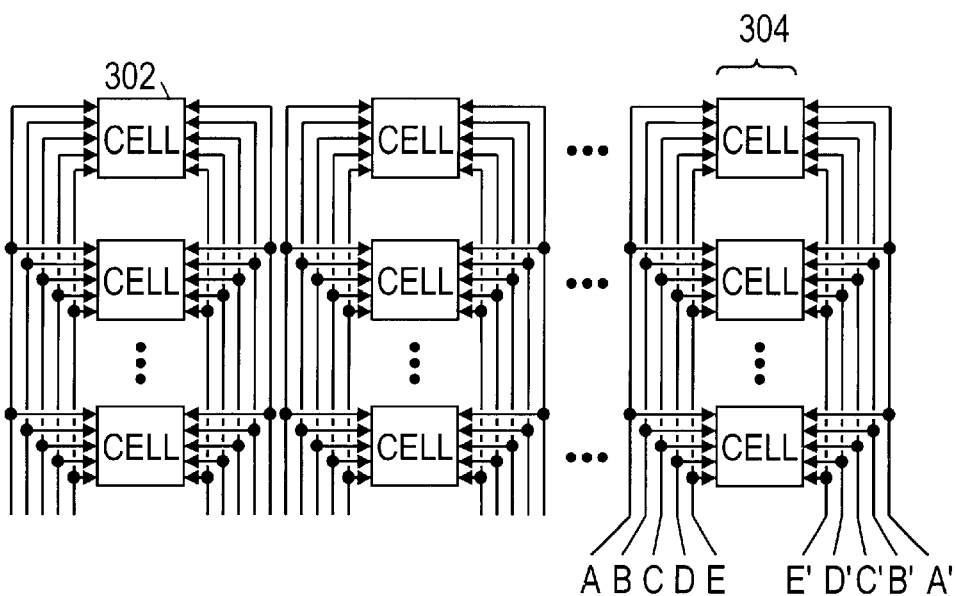
FIG. 3 depicts a schematic block diagram of a five-port memory cell array with complementary bit lines.
Figure 4:
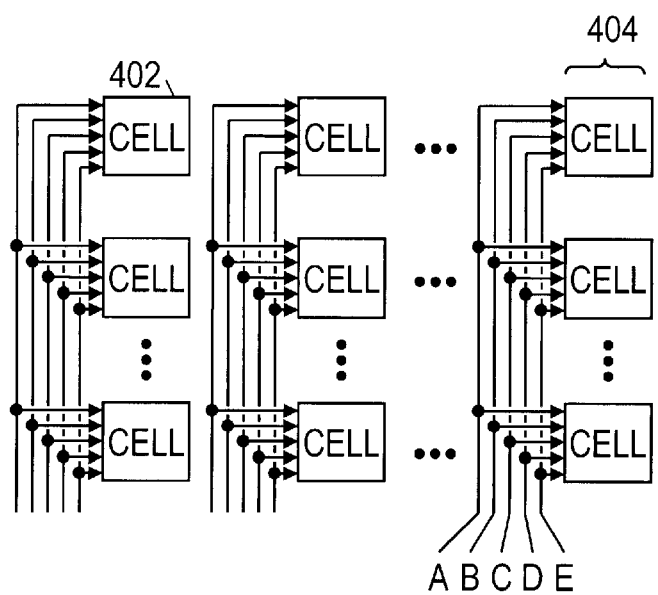
FIG. 4 depicts a schematic block diagram of a five-port memory cell array with single-ended bit lines.

FIGS. 3 and 4 show exemplary multiport memory cell arrays having typical bit line configurations. FIG. 3 shows an array having cells 302 that, when enabled by assertion of a word line, drive or receive complementary values on pairs of bit lines associated with a given port. The bit lines for column 304 are labeled with port names A, B, C, D, and E. Each of these is paired with a complementary bit line A', B', C', D', and E', respectively. It is noted that the capacitive coupling between bit lines of adjacent ports will dominate over coupling between non-adjacent ports. Thus, for example, the bit lines of port B will couple capacitively to the bit lines of ports A and C much more strongly than to ports D or E. This observation holds true for the array of FIG. 4, in which memory cells 402 each only drive or receive from a single bit line per port. The bit lines for column 404 are labeled with the port names, and again, the capacitive coupling will be primarily determined by the bit lines of the adjacent ports.

Accordingly, to stress the memory cells, it is desirable to clock any given port independently of ports adjacent to it. FIGS. 5A and 5B show two BIST configurations in which the BIST unit generates multiple port clock signals. BIST unit 501 generates two port clock signals and a clock multiplexer control signal 502 in response to assertion of the test signal. BIST unit 503 generates three port clock signals and a clock multiplexer control signal 502 in response to assertion of the test signal. Thus, the BIST unit can provide one or more clock skews to enable detection of soft faults in addition to the faults that would normally be detected by the BIST unit. In some memory array configurations, the ability to provide two different clock skews (one skew for each port adjacent to a given port) may provide enhanced fault detection relative to the use of a single clock skew (both ports adjacent to a given port share a common clock skew). For these memory arrays, BIST unit 503 may be preferred where it is desired to have the BIST unit generate the port clocks for the tests.

Figure 6:
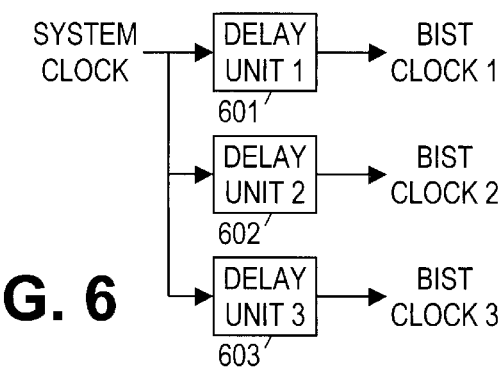
FIG. 6 is a functional block diagram of a clock-skew mechanism.

FIG. 6 shows a block diagram of one BIST port clock generation mechanism. The system clock is provided to three clock delay units 601, 602, and 603. Each of these clock delay units may be preset, but they are preferably adjustable by the BIST unit. One known method for implementing adjustable delays relies on the use of differential amplifier configurations with adjustable "current sources". A well-known property of standard differential amplifier configurations is that the switching speed of the differential amplifier depends on the value of the current source. The smaller the current source, the slower the switching speed. A common emulation of current sources in differential amplifiers is a single transistor, or alternatively, two transistors in a current-mirror configuration. Either of these emulations is easily adjustable. Accordingly, the delays for each delay element may be easily and independently adjusted, whereby a range of clock skews can be obtained.

Numerous variations and modifications will become apparent to those skilled in the art once the above disclosure is fully appreciated. It is intended that the following claims be interpreted to embrace all such variations and modifications.

What is claimed is:

1. A device which comprises:
    a multiport memory; and
    a built-in self-test (BIST) unit coupled to said multiport memory and configured to apply a pattern of read and write test operations concurrently to multiple ports of said multiport memory to establish functionality of said multiport memory, wherein test operations directed to a first port are clocked by a first clock signal and test operations to a second port are clocked by a second clock signal, wherein said first clock signal is offset in time relative to said second clock signal by less than a complete period of the first clock signal.

2. The device of claim 1, wherein said first clock signal is offset in time relative to said second clock signal by a preset clock skew.

3. The device of claim 1, wherein the first port and the second port have adjacent bit lines in the multiport memory.

4. The device of claim 1, wherein test operations applied by the BIST unit to a third port are clocked by a third clock signal, wherein the third clock signal is offset in time relative to each of the first and second clock signals.

5. The device of claim 4, wherein each port has bit lines that are adjacent to bit lines of no more than two other ports, wherein while the BIST unit applies test operations to multiple ports of said multiport memory, each port receives a clock signal different from each clock signal received by ports having adjacent bit lines.

6. The device of claim 1, wherein the BIST unit generates said first and second clock signals from a system clock.

7. The device of claim 1, further comprising a clock multiplexer for each port, wherein the clock multiplexers are each configured to receive a mode signal, a shared BIST clock and an externally-generated respective port clock, wherein when said clock multiplexers provide the externally-generated respective port clocks to the memory when said mode signal is asserted, wherein said externally-generated respective port clocks include said first and second clock signals.

8. A device which comprises:
    a multiport memory; and
    a built-in self-test (BIST) unit coupled to said multiport memory and configured to apply a pattern of read and write test operations concurrently to multiple ports of said multiport memory to establish functionality of said multiport memory, wherein test operations directed to a first port are clocked by a first clock signal and test operations to a second port are clocked by a second clock signal, wherein said first clock signal is offset in time relative to said second clock signal by less than a complete period of the first clock signal, wherein said first clock signal is offset in time relative to said second clock signal by a preset clock skew, wherein said preset clock skew is calculated to allow write transitions on one or more bit lines of the first port to occur during a noise-sensitive portion of a read operation conducted on one or more bit lines of the second port.

9. A method of testing a multiport memory, wherein the method comprises:
    concurrently applying a pattern of test operations to multiple ports of the multiport memory, wherein said pattern is configured to ascertain functionality of the multiport memory;
    clocking test operations to a first port of said multiple ports with a first clock signal; and
    clocking test operations to a second port of said multiple ports with a second clock signal, wherein said first and second clock signals are offset by a clock skew.

10. The method of claim 9, further comprising:
    applying said pattern of test operations with a plurality of clock skew values.

11. The method of claim 9, further comprising:
applying a first adjustable delay to a system clock to generate the first clock signal; and
applying a second adjustable delay to the system clock to generate the second clock signal.

12. The method of claim 9, wherein said first and second ports have adjacent bit lines.

13. The method of claim 9, wherein said first and second clock signals clock test operations to alternate ports.

14. The method of claim 9, further comprising:
clocking test operations to a third port of said multiple ports with a third clock signal, wherein said first and third clock signals are offset by a second clock skew unequal to the skew between said first and second clock signals.

15. The method of claim 14, wherein said second and third ports have bit lines adjacent to bit lines of said first port.

16. The method of claim 14, further comprising
applying a first adjustable delay to a system clock to generate the first clock signal;
applying a second adjustable delay to the system clock to generate the second clock signal; and
applying a third adjustable delay to the system clock to generate the third clock signal.

17. The method of claim 14, wherein said first, second, and third clock signals each clock test operations to every third port.

18. A method of testing a multiport memory, wherein the method comprises:
concurrently applying a pattern of test operations to multiple ports of the multiport memory, wherein said pattern is configured to ascertain functionality of the multiport memory;
clocking test operations to a first port of said multiple ports with a first clock signal; and
clocking test operations to a second port of said multiple ports with a second clock signal, wherein said first and second clock signals are offset by a clock skew, wherein said clock skew is selected to induce transitions on bit lines of the second port during a noise-sensitive portion of test operations on the first port.

19. A device which comprises:
a multiport memory; and
a built-in self-test (BIST) unit coupled to said multiport memory and configured to apply a pattern of read and write test operations concurrently to multiple ports of said multiport memory to establish functionality of said multiport memory, wherein test operations directed to a first port are clocked by a first clock signal and test operations to a second port are clocked by a second clock signal, wherein said first clock signal is offset in time relative to said second clock signal by an adjustable clock skew.

* * * * *